United States Patent
Park

(10) Patent No.: US 9,190,122 B2
(45) Date of Patent: Nov. 17, 2015

(54) DRIVER OF SEMICONDUCTOR MEMORY DEVICE AND DRIVING METHOD THEREOF

(71) Applicant: SK hynix Inc., Icheon-si Gyeonggi-do (KR)

(72) Inventor: Sang Il Park, Suwon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 443 days.

(21) Appl. No.: 13/846,371

(22) Filed: Mar. 18, 2013

(65) Prior Publication Data

US 2014/0177374 A1 Jun. 26, 2014

(30) Foreign Application Priority Data

Dec. 21, 2012 (KR) .................. 10-2012-0150999

(51) Int. Cl.
*G11C 5/14* (2006.01)
(52) U.S. Cl.
CPC ...................... *G11C 5/148* (2013.01)
(58) Field of Classification Search
CPC .......... G11C 5/14; G11C 5/145; G11C 5/148; G11C 5/147; G11C 2207/2227
See application file for complete search history.

(56) References Cited

U.S. PATENT DOCUMENTS

| 6,269,046 | B1 | 7/2001 | Lee et al. | |
|---|---|---|---|---|
| 7,646,653 | B2 | 1/2010 | Choi et al. | |
| 8,310,894 | B1* | 11/2012 | Su et al. | 365/226 |
| 2010/0182867 | A1* | 7/2010 | Lee | 365/226 |
| 2013/0201765 | A1* | 8/2013 | Cho et al. | 365/189.02 |

* cited by examiner

*Primary Examiner* — Hien Nguyen
(74) *Attorney, Agent, or Firm* — William Park & Associates Ltd.

(57) ABSTRACT

A driver of a semiconductor memory device and driving method thereof is disclosed, which relates to a technology for reducing consumption of a leakage current not required for a driver circuit of a semiconductor memory device. The driver of the semiconductor memory device includes a drive controller configured to selectively provide a first voltage and a second voltage, that have different levels in response to a power-down signal, to a first node; an input driver configured to selectively output a voltage received from the first node in response to a decoding signal; and an output driver configured to be driven in response to an output voltage of the input driver.

20 Claims, 2 Drawing Sheets

DRIVER OF SEMICONDUCTOR MEMORY DEVICE AND DRIVING METHOD THEREOF

CROSS-REFERENCE TO RELATED APPLICATION

The priority of Korean patent application No. 10-2012-0150999 filed on Dec. 21, 2012, the disclosure of which is hereby incorporated in its entirety by reference, is claimed.

BACKGROUND OF THE INVENTION

1. Technical Field

Embodiments of the present invention generally relate to a driver of a semiconductor memory device, and more particularly to a technology for reducing consumption of a leakage current not required for a driver circuit of a semiconductor memory device.

2. Related Art

Generally, according to a memory unit of a dynamic random access memory (DRAM), a plurality of unit cells, each of which has one transistor and one capacitor, is configured in the form of a matrix in a manner that the unit cells are arranged in a plurality of rows and a plurality of columns.

In addition, the semiconductor memory device includes a memory array, a row decoder, a column decoder, a sense amplifier, and pairs of input/output (I/O) lines. A memory array includes a plurality of memory cells, and a plurality of word lines and pairs of bit lines are coupled to the memory cells. Pairs of bit lines and pairs of I/O lines are coupled to the sense amplifier. In addition, the pairs of I/O lines are controlled by a plurality of column selection lines so as to be electrically coupled to the sense amplifier.

A row decoder decodes a row address received from an external part so as to select some of word lines, and a column decoder decodes a column address received from an external part so as to select some of column selection lines. In addition, the row decoder includes drivers for driving a plurality of word lines in an output end, and the column decoder includes drivers for driving a plurality of column selection lines in an output end.

Specifically, each MOS transistor contained in each of the row decoder and the column decoder of the semiconductor memory device configured to use a low power-supply voltage has a very small gate width, such that a leakage current occurs even when there is a small voltage difference between a source and a drain of each MOS transistor in a standby mode of the row decoder and the column decoder.

The small amount of a leakage current occurs in the MOS transistors, such that it does not greatly affect power consumption of the semiconductor memory device when a small number of row decoders and a small number of column decoders are used. However, with the increasing integration degree of the semiconductor memory device, the number of row decoders and the number of column decoders are rapidly increased in proportion to the increasing integration degree of the semiconductor memory device. Specifically, if the number of row decoders and the number of column decoders are increased, the amount of leakage current is also increased such that total power consumption of the semiconductor memory device is also increased.

In order to reduce the amount of leakage current of the decoder, the related art has widely used a method for blocking a power source of a transistor. However, there is needed a much larger-sized driver for facilitating supply of a power source. The higher the frequency, the larger the number of transistors to be driven, so that the related art may have difficulty in achieving smooth power supply. In addition, if a leakage current of the driver is increased, a direct current (DC) failure occurs, resulting in reduction of productivity.

In recent times, systems configured to use semiconductor memory devices have been rapidly developed to have smaller sizes and lower power consumption. Therefore, it is impossible for high power-consumption semiconductor memory devices to be used for small-sized or portable-sized systems, such that commercial viability thereof is greatly decreased. Especially, a leakage current encountered in products (such as mobile phones) that have low power-consumption as important elements for high product competitiveness is directly associated with such product competitiveness.

BRIEF SUMMARY OF THE INVENTION

Various embodiments of the present invention are directed to providing a driver of a semiconductor memory device that substantially obviates one or more problems due to limitations and disadvantages of the related art.

The embodiments of the present invention relates to a technology for controlling supply of heterogeneous power-supply voltages in response to a state of a power-down signal at a previous stage of a driver of the last end so as to reduce a transistor channel-off leakage current capable of being generated in the last end of the driver.

In accordance with an embodiment of the present invention, a driver of a semiconductor memory device includes: a drive controller configured to selectively provide a first voltage and a second voltage, that have different levels in response to a power-down signal, to a first node; an input driver configured to selectively output a voltage received from the first node in response to a decoding signal; and an output driver configured to be driven in response to an output voltage of the input driver.

A method of driving with a semiconductor memory device in accordance with an embodiment includes: providing, with a drive controller, a first voltage or a second voltage, that have different levels in response to a power-down signal, to a first node; outputting, with an input driver, a voltage received from the first node in response to a decoding signal; and driving an output driver in response to an output voltage of the input driver.

It is to be understood that both the foregoing general description and the following detailed description of the present invention are exemplary and explanatory and are intended to provide further explanation of the invention as claimed.

DESCRIPTION OF EMBODIMENTS

Reference will now be made in detail to the embodiments of the present invention, examples of which are illustrated in the accompanying drawings. Wherever possible, the same reference numbers will be used throughout the drawings to refer to the same or like parts.

Figure 1:
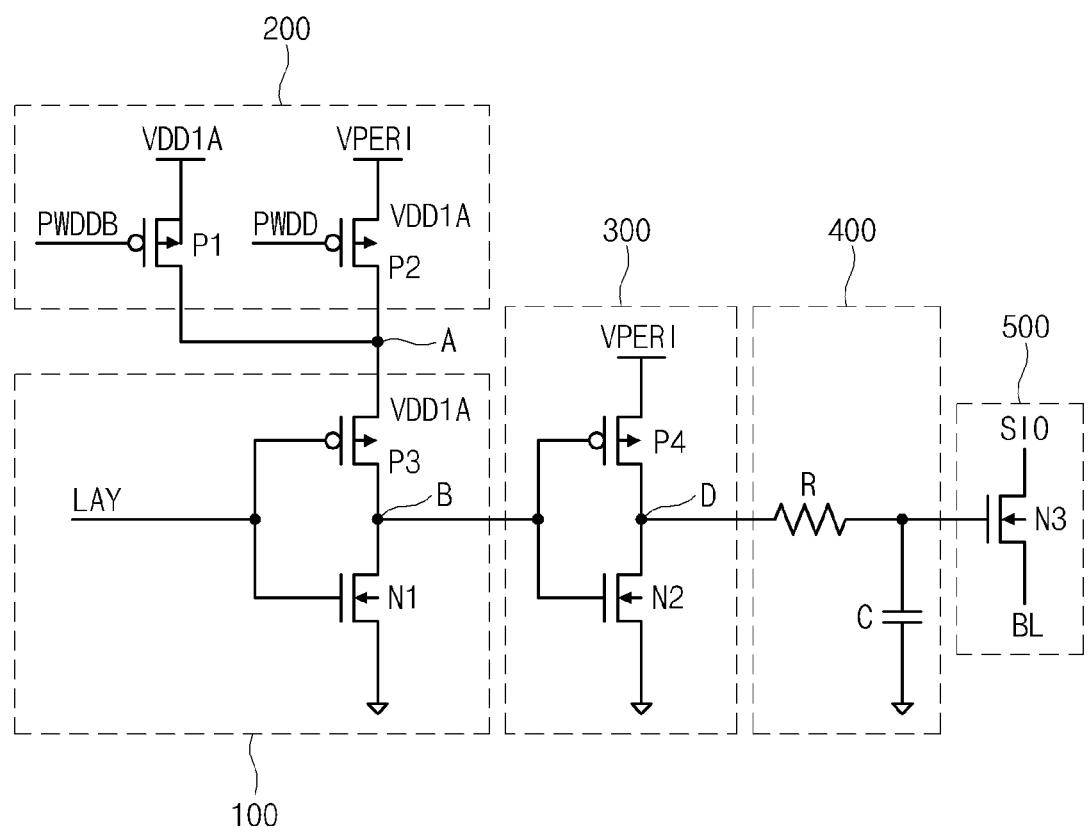
FIG. 1 is a circuit diagram illustrating a semiconductor memory device according to an embodiment of the present invention.

FIG. 1 is a circuit diagram illustrating a semiconductor memory device according to an embodiment of the present invention.

Referring to FIG. 1, the semiconductor memory device according to an embodiment of the present invention may include an input driver 100, a drive controller 200, an output driver 300, a delay unit 400, and a bit line driver 500. The input driver 100 may include a pull-up driving element and a pull-down driving element that are serially coupled between a node A and a ground voltage terminal. Here, the pull-up driving element may include a PMOS transistor P3, and the pull-down driving element may include an NMOS transistor N1.

A decoding signal LAY is applied to the PMOS transistor P3 and the NMOS transistor N1 through a common gate terminal. The decoding signal LAY is received from the pre-decoder. In case of a standby mode, the decoding signal LAY reaches a ground voltage (VSS) level. In case of an active mode, the decoding signal LAY changes from one level (VPERI) to the ground voltage (VSS) level. The PMOS transistor P3 receives a power-supply voltage VDD1A through a bulk terminal.

The drive controller 200 outputs a first voltage and a second voltage, that have different voltage levels according to power-down signals (PWDDB, PWDD), to the node A. The first voltage has a power-supply voltage (VDD1A) level, and the second voltage has a peri-voltage (VPERI) level. The power-supply voltage (VDD1A) has a higher level than the peri-voltage (VPERI). The power-down signal (PWDDB) is an inversion signal of the power-down signal (PWDD).

The drive controller 200 may include a driving element for providing a first voltage and a driving element for providing a second voltage. In this case, the driving element for providing the first voltage includes a PMOS transistor P1. The PMOS transistor P1 is coupled between the first voltage input terminal and the node A so that it receives a power-down signal PWDDB through a gate terminal. The PMOS transistor P1 receives a power-supply voltage VDD1A through a bulk terminal. The PMOS transistor P1 applies the same power-supply voltage VDD1A to a source terminal and a bulk terminal so that the transistor can be normally operated.

The driving element for providing the second voltage may include a PMOS transistor P2. The PMOS transistor P2 is coupled between the second voltage input terminal and the node A so that it receives a power-down signal PWDD through a gate terminal. The PMOS transistor P2 receives the power-supply voltage VDD1A through a bulk terminal.

The output driver 300 may include a pull-up driving element and a pull-down driving element that are serially coupled between the second voltage input terminal and the ground voltage terminal. The pull-up driving element may include a PMOS transistor P4, and the pull-down driving element may include an NMOS transistor N2. Here, a common gate terminal of the PMOS transistor P4 and the NMOS transistor N2 is connected to a node B. The second voltage applied to a source terminal of the PMOS transistor P4 is a peri-voltage level VPERI.

The delay unit 400 may include a resistor R and a capacitor C, such that it delays an output signal of a node D for a predetermined time. In this case, the resistor R is coupled to the node D and one end of the capacitor C. The capacitor C is coupled between one end of the resistor R and a ground voltage terminal.

The bit line driver 500 may selectively control connection between a connection node SIO and a bit line BL in response to an output signal of the delay unit 400. In this case, the connection node SIO is a node connected to a sense-amplifier.

FIG. 1 also illustrates that the bit line driver 500 includes a NMOS transistor coupled between the connection node SIO and the bit line BL, and having a gate coupled to the one end of the resistor R and capacitor C of the delay unit 400.

The operations of the driver of the semiconductor memory device according to the embodiments of the present invention will hereinafter be described with reference to FIG. 2.

The driver of the semiconductor memory device may include an input driver 100 and an output driver 300. However, assuming that the PMOS transistor P4 contained in the output driver 300 acting as the last output end is a transistor having a large channel width, an off leakage current may occur in the standby mode.

The driver of a general semiconductor memory device is configured to install a separate transistor at a peri-voltage (VPERI) input terminal of the output driver 300 so as to reduce a leakage current of the PMOS transistor P4. The separate transistor is configured to selectively provide a peri-voltage VPERI to a source terminal of the PMOS transistor P4 according to a power-down signal PWDDB, such that it can prevent an off leakage current from occurring in the PMOS transistor P4.

However, it is necessary to use an additional transistor having a higher threshold voltage than the PMOS transistor P4 so as to prevent the occurrence of a channel-off leakage current of the PMOS transistor P4. In this case, it is necessary to use a larger-sized transistor than the PMOS transistor P4, resulting in an increase in driver area. Likewise, if it is necessary to reduce a channel-off leakage current by increasing a channel length of the PMOS transistor P4, the driver area also increases.

In addition, the PMOS transistor P4 and the NMOS transistor N2 are coupled in series to each other, and the common gate terminal of the PMOS and NMOS transistors P4 and N2 is coupled to the node B. Accordingly, assuming that RC loading of the node B to be driven by the PMOS transistor P4 increases, it is difficult for the output driver 300 to be operated in response to a high frequency.

In order to satisfy low power consumption requirements in future, the PMOS transistor P4 must be smoothly operated. For this operation, a threshold voltage of the PMOS transistor P4 needs to be controlled at a low voltage. If the channel length is increased to prevent an off leakage current from being generated in the PMOS transistor P4, there is a limitation in improving an off leakage current using the channel length. As a result, there is a need to use a separate transistor having a high threshold voltage, such that it is impossible to simplify a fabrication process, resulting in increased production costs.

An embodiment of the present invention may not include a separate drive transistor for preventing an off leakage current from being generated in the output driver 300. In addition, the embodiments of the present invention control a source power of the input driver 100 through the drive controller 200 having heterogeneous power-supply voltages, such that the source power can be controlled in different ways according to the standby mode and the active mode.

In the case of the standby mode, the channel-off leakage current may occur in the PMOS transistor P4. In order to prevent the channel-off leakage current of the PMSO transistor P4, the PMOS transistor P4 receives different levels of voltage from the input driver 100 serving as a previous stage of the PMOS transistor P4.

The voltage level output from the input driver 100 is controlled by the drive controller 200. The drive controller 200 may include a PMOS transistor P1 for selectively providing a power-supply voltage VDD1A and a PMOS transistor P2 for selectively providing a peri-voltage VPERI.

For example, in case of the standby mode, if a power-down signal PWDDB is at a low level, the PMOS transistor P1 is turned on so as to provide a power-supply voltage VDD1A to the node A. On the other hand, in case of the active mode, if a power-down signal PWDD is at a low level, the PMOS transistor P2 is turned on so that a lower peri-voltage VPERI than the power-supply voltage VDD1A is applied to the node A.

In case of the standby mode, the power-down signal PWDDB is at a low level and the power-down signal PWDD is at a high level. As a result, the PMOS transistor P1 is turned on and the PMOS transistor P2 is turned off such that the power-supply voltage VDD1A is applied to the node A.

In this case, a peri-voltage VPERI is applied to a source terminal of the PMOS transistor P2, and a higher power-supply voltage VDD1A than the peri-voltage VPERI is applied to a drain terminal of the PMOS transistor P2. Therefore, the power-supply voltage (VDD1A) is applied as a bulk bias voltage to the bulk terminal of the PMOS transistor P2, such that the PMOS transistor P2 is not unnecessarily turned on during the standby mode.

In addition, the decoding signal LAY is at a low level in the standby mode. Accordingly, the PMOS transistor P3 of the input driver 100 is turned on and the PMOS transistor P4 is turned off so that a power-supply voltage VDD1A of the node A is applied to the node B. In this case, if the power-supply voltage VDD1A is applied to the node B, the peri-voltage VPERI is applied to a source terminal of the PMOS transistor P4 and a power-supply voltage VDD1A higher than the peri-voltage VPERI is applied to a gate terminal of the PMOS transistor P4.

Figure 2:
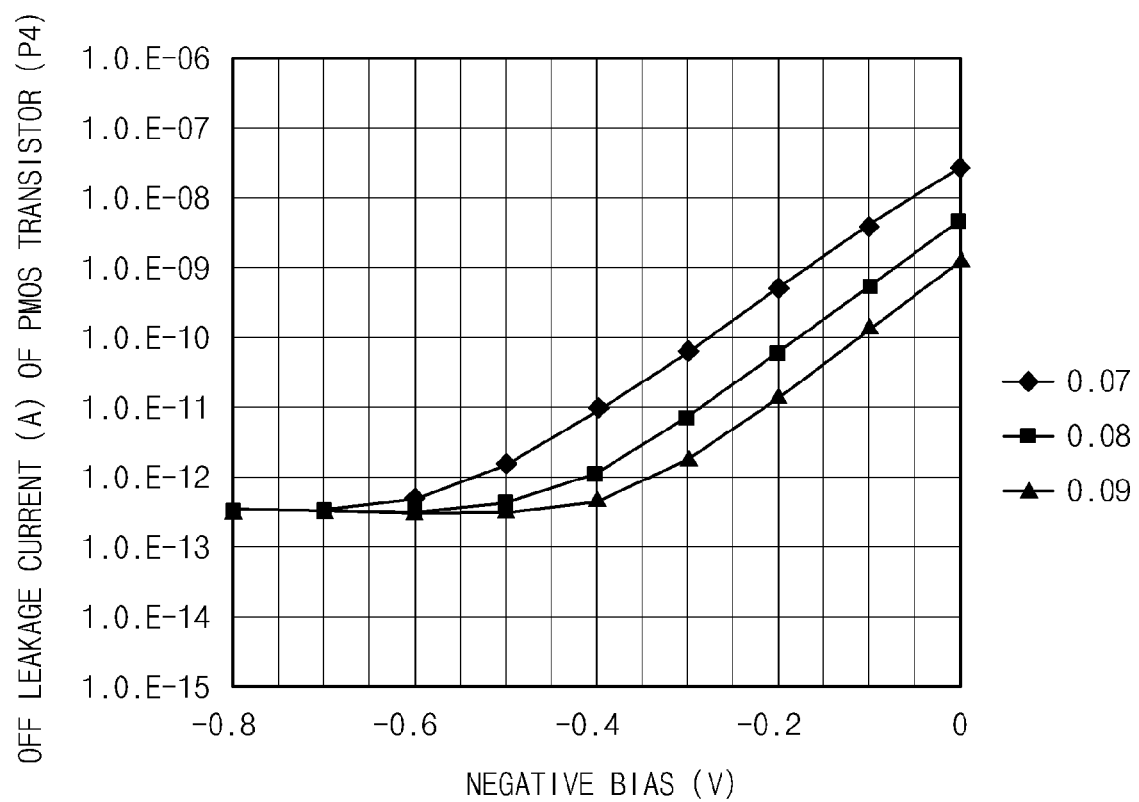
FIG. 2 is a graph illustrating a channel-off leakage current reduction rate of a transistor in a standby mode according to an embodiment of the present invention.

FIG. 2 is a graph illustrating the measurement result of a channel-off leakage current changing with a gate source voltage (Vgs) of the PMOS transistor P4. On the x-axis a negative bias in volts V is illustrated, and on the y-axis off leakage current in amps. A of a PMOS transistor P4 is illustrated. Graph lines of 0.07, 0.08, and 0.09 are also shown in FIG. 2. If a voltage higher than a voltage of the source terminal of the PMOS transistor P4 is applied to a gate terminal, a negative bias is also applied to the gate terminal such that it can be recognized that an off leakage current flowing through a channel region of the PMOS transistor P4 is greatly reduced. In the case in which a power-supply voltage VDD1A is applied to the gate terminal of the PMOS transistor P4, an off leakage current is further reduced as compared to the other case in which the same peri-voltage VPERI as the source voltage is applied to the gate terminal of the PMOS transistor P4.

On the other hand, in case of the active mode, the power-down signal PWDD is at a low level and the power-down signal PWDDB is at a high level. As a result, the PMOS transistor P1 is turned off and the PMOS transistor P2 is turned on such that the peri-voltage VPERI is applied to the node A. In addition, in case of the active mode, the decoding signal LAY is at a high level.

As a result, the PMOS transistor P3 of the input driver 100 is turned off and the PMOS transistor P4 is turned on, such that a ground voltage is applied to the node B. In this case, a power-supply voltage VDD1A is applied to a bulk terminal of the PMOS transistor P3. Accordingly, since the bulk voltage (i.e., power-supply voltage VDD1A) has a higher voltage level than the peri-voltage VPERI applied to the gate terminal, the off leakage current does not flow through the PMOS transistor P3.

If the ground voltage is applied to the node B, the PMOS transistor P4 is turned on and the NMOS transistor N2 is turned off. The PMOS transistor P4 provides the peri-voltage VPERI through the node D.

The embodiments of the present invention has been applied to the column decoder controlled by the decoding signal LAY for convenience of description and better understanding of the present invention. However, the scope or spirit of the present invention is not limited thereto, and can also be applied to the row decoder and other drivers without difficulty.

As is apparent from the above description, the driver of the semiconductor memory device according to the embodiment of the present invention controls supply of heterogeneous power-supply voltages in response to a state of a power-down signal at a previous stage of a driver of the last end so as to reduce a transistor channel-off leakage current of the last end.

The driver of the semiconductor memory device according to the embodiment of the present invention is applied to an array decoder or large-sized driver of a DRAM, such that a channel-off leakage current can be improved.

In addition, although a power-supply voltage is reduced, a power-supply voltage of the last end can be adjusted to be a high voltage, such that a DC failure is prevented from being generated and productivity of the semiconductor devices can be improved.

Those skilled in the art will appreciate that the present invention may be carried out in other specific ways than those set forth herein without departing from the spirit and essential characteristics of the present invention. The above embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein. Also, it is obvious to those skilled in the art that claims that are not explicitly cited in each other in the appended claims may be presented in combination as an embodiment of the present invention or included as a new claim by a subsequent amendment after the application is filed.

Although a number of illustrative embodiments consistent with the invention have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A driver of a semiconductor memory device comprising:
a drive controller configured to selectively provide a first voltage and a second voltage, that have different levels in response to a power-down signal, to a first node;
an input driver configured to selectively output a voltage received from the first node in response to a decoding signal; and
an output driver configured to be driven in response to an output voltage of the input driver.

2. The driver of the semiconductor memory device according to claim 1, wherein the input driver includes a pull-up driving element and a pull-down driving element that are serially coupled between the first node and a ground voltage terminal so as to receive the decoding signal through a common gate terminal.

3. The driver of the semiconductor memory device according to claim 2, wherein the pull-up driving element receives a power-supply voltage through a bulk terminal.

4. The driver of the semiconductor memory device according to claim 1, wherein the input driver enables the decoding signal to reach a low level in a standby mode so as to output a voltage of the first node.

5. The driver of the semiconductor memory device according to claim 1, wherein the first voltage is higher than the second voltage.

6. The driver of the semiconductor memory device according to claim 1, wherein the first voltage is at a power-supply voltage level.

7. The driver of the semiconductor memory device according to claim 1, wherein the second voltage is at a peri-voltage level.

8. The driver of the semiconductor memory device according to claim 1, wherein the drive controller includes:
a first drive element configured to selectively provide the first voltage to the first node in response to the power-down signal; and
a second drive element configured to selective provide a second voltage lower than the first voltage to the first node in response to an inverting signal of the power-down signal.

9. The driver of the semiconductor memory device according to claim 8, wherein the first drive element includes a first PMOS transistor coupled between an input terminal of the first voltage and the first node, such that the first PMOS transistor receives the power-down signal through a gate terminal thereof.

10. The driver of the semiconductor memory device according to claim 9, wherein the first PMOS transistor receives the first voltage through a bulk terminal 11. The driver of the semiconductor memory device according to claim 8, wherein the second drive element includes a second PMOS transistor coupled between an input terminal of the second voltage and the first node, such that the second PMOS transistor receives the inverting signal through a gate terminal thereof and receives the first voltage through a bulk terminal.

12. The driver of the semiconductor memory device according to claim 11, wherein the second PMOS transistor receives the first voltage through a bulk terminal.

13. The driver of the semiconductor memory device according to claim 8, wherein the drive controller enables the second drive element to be turned on during an active mode so as to provide the second voltage to a first node, and enables the first drive element to be turned on during a standby mode so as to provide the first voltage to a first node.

14. The driver of the semiconductor memory device according to claim 1, wherein the output driver includes a pull-up driving element and a pull-down driving element that are serially coupled between an input terminal of the second voltage and a ground voltage terminal so as to receive an output voltage of the input driver through a common gate terminal.

15. The driver of the semiconductor memory device according to claim 14, wherein the same voltage as the second voltage is applied to the gate terminal during an active mode, and the first voltage higher than the second voltage is applied to the gate terminal during a standby mode.

16. The driver of the semiconductor memory device according to claim 1, further comprising:
a delay unit configured to delay an output signal of the output driver for a predetermined time; and
a bit line driver configured to selectively interconnect a connection node of a sense-amplifier and a bit line in response to an output signal of the delay unit.

17. The driver of the semiconductor memory device according to claim 16, wherein the bit line driver includes a NMOS transistor coupled between the connection node of the sense-amplifier and the bit line, and a gate of the NMOS transistor configured to receive the output signal of the delay unit.

18. The driver of the semiconductor memory device according to claim 17, wherein the delay unit includes a resistor having a first end for receiving the output signal of the output driver and a second end coupled to both a capacitor and the gate of the NMOS transistor.

19. The driver of the semiconductor memory device according to claim 18, wherein the capacitor is coupled between the second end of the resistor and a ground voltage terminal.

20. A method of driving with a semiconductor memory device comprising:
providing, with a drive controller, a first voltage or a second voltage, that have different levels in response to a power-down signal, to a first node;
outputting, with an input driver, a voltage received from the first node in response to a decoding signal; and
driving an output driver in response to an output voltage of the input driver.

* * * * *